United States Patent [19]

Aida

[11] Patent Number: 5,140,259
[45] Date of Patent: Aug. 18, 1992

[54] METER DEVICE WITH INTEGRAL SECTIONAL CASING

[75] Inventor: Takeshi Aida, Nagaoka, Japan

[73] Assignee: Nippon Seiki Co., Ltd., Niigata, Japan

[21] Appl. No.: 584,010

[22] Filed: Sep. 18, 1990

[30] Foreign Application Priority Data

Sep. 29, 1989 [JP] Japan .................. 1-255673

[51] Int. Cl.$^5$ ............................... G01R 1/04
[52] U.S. Cl. ..................... 324/156; 361/369; 361/399
[58] Field of Search ............ 324/156, 105, 158 F, 324/157; 248/27.1; 361/369, 399, 417–420

[56] References Cited

U.S. PATENT DOCUMENTS

| | | | |
|---|---|---|---|
| 3,757,218 | 9/1973 | Oliverio et al. | 324/156 |
| 4,176,315 | 11/1979 | Sunnarborg | 324/156 |
| 4,404,522 | 9/1983 | Pucciarello | 324/156 X |
| 4,464,626 | 8/1984 | Thomas et al. | 324/156 |
| 4,760,333 | 7/1988 | Ichimura et al. | 324/156 X |
| 4,771,368 | 9/1988 | Tsukamoto et al. | 362/29 |
| 4,886,227 | 12/1989 | Matl | 248/27.1 |

FOREIGN PATENT DOCUMENTS

| | | |
|---|---|---|
| 0313739 | 7/1988 | European Pat. Off. |
| 63-121488 | 8/1988 | Japan |
| 1527357 | 10/1978 | United Kingdom |

*Primary Examiner*—Kenneth A. Wieder
*Assistant Examiner*—Warren S. Edmonds
*Attorney, Agent, or Firm*—Lowe, Price, LeBlanc & Becker

[57] ABSTRACT

A meter device in which a casing having a front opening portion and a back opening portion is provided therein with a partition wall to form a front-side containing space and a back-side containing space, an electric meter main body is contained fixedly in the front-side containing space, and a circuit board is attached to the back opening portion side of the casing, with the electronic part mounting side directed toward the partition wall, whereby an electronic part mounted on the circuit board is contained in the back-side containing space. The meter device facilitates assembling operations and electrically connecting operations. With the electronic part containing space partitioned into a plurality of containing spaces, the electronic part which generates heat can be isolated from the other electronic parts, whereby thermal interference is reduced.

6 Claims, 3 Drawing Sheets

METER DEVICE WITH INTEGRAL SECTIONAL CASING

BACKGROUND OF THE INVENTION

1. Field of the Invention

This invention relates to a meter device, and more particularly to a meter device in which an electric meter main body is contained fixedly in a casing, a circuit board provided with a driving circuit for the electric meter main body is attached to the casing, and the circuit board and the electric meter main body are electrically connected to each other.

2. Description of the Prior Art

A meter device of the above-mentioned type, conventionally used as an automobile meter device or the like, has been disclosed, for instance, in Japanese Utility Model Application Laid-Open (KOKAI) No. 63-121488 (1988). In the meter device, an electric meter main body is contained fixedly in an inside bottom portion of a casing, which is opened on the front side. In the casing, a circuit board for driving the meter main body, with electronic parts mounted thereon, is attached to a bottom or a side portion of the meter main body. The circuit board and the meter main body are electrically connected to each other. A flexible printed wiring board is disposed at an outside bottom portion of the casing, and is electrically connected to the circuit board. The flexible printed wiring board is supplied with an external power supply from a battery and with signals from detection portions, through a connector.

In the prior art as mentioned above, the electric meter main body and the circuit board with the electronic parts mounted thereon are contained fixedly in the casing, at an outside bottom portion of which is disposed the flexible printed wiring board for supplying the external power supply and the detection signals to the circuit board therethrough, and the electric meter main body is driven by a driving circuit on the circuit board. Therefore, it is necessary to assemble the circuit board, with the electronic parts mounted thereon, and the flexible printed wiring board into the casing, and to make electrical connection between them. Consequently, the meter device according to the prior art requires troublesome assembling operations and electrically connecting operations, and has a complicated construction with a large number of component parts.

SUMMARY OF THE INVENTION

This invention contemplates overcoming the above-mentioned problems in the prior art.

It is a first object of this invention to provide a meter device in which an electric meter main body is fixedly contained into a front-side containing space in a casing from the front opening portion side of the casing, a circuit board is fixed on the back-side of the casing, the electric meter main body and the circuit board are assembled in electrical connection with each other, and electronic parts mounted on the circuit board are disposed in a back-side containing space, whereby assembling operations and electrically connecting operations are facilitated and, also, a reduction in the number of component parts can be contrived.

It is a second object of this invention to provide a meter device in which a plurality of electronic parts can be contained in a casing in such a condition as to reduce the thermal influence of one or more electronic part the operation of which is accompanied by heat generation, on the other electronic parts.

BRIEF DESCRIPTION OF THE DRAWINGS

FIGS. 1 to 3 illustrate a first embodiment of this invention, in which
FIG. 1 is a sectional view,
FIG. 2 is a sectional view taken along line A—A of FIG. 1,
and
FIG. 3 is an exploded perspective view.

DETAILED DESCRIPTION OF THE PREFERRED EMBODIMENTS

Figure 1:
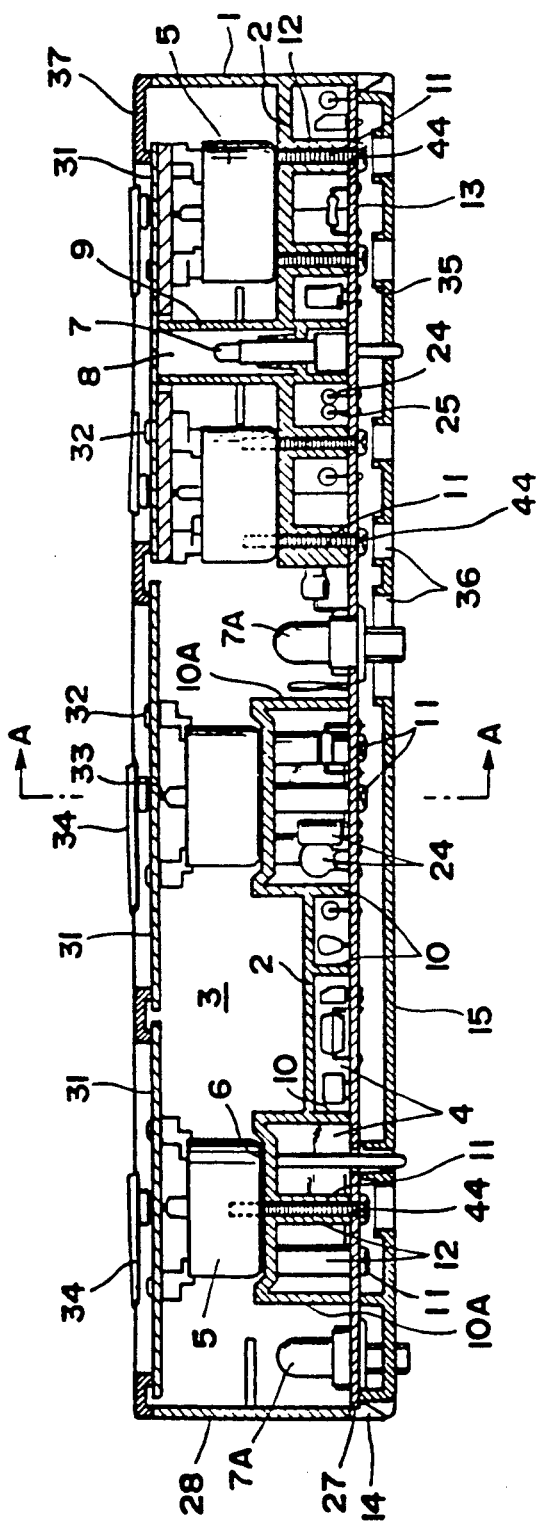
Figure 2:
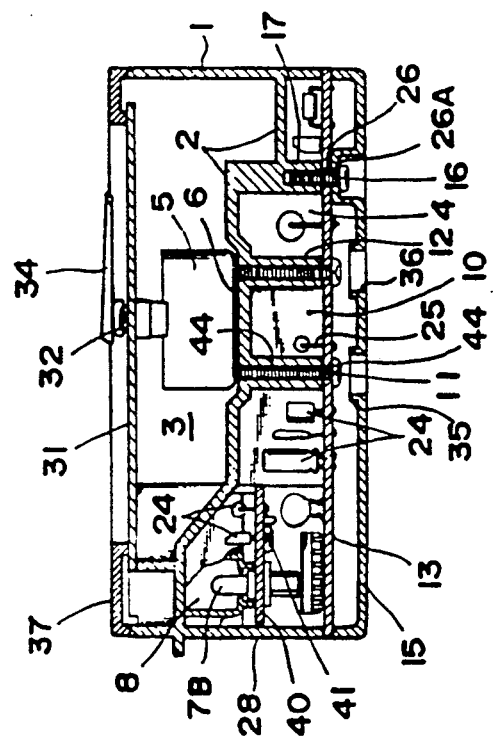
Figure 3:
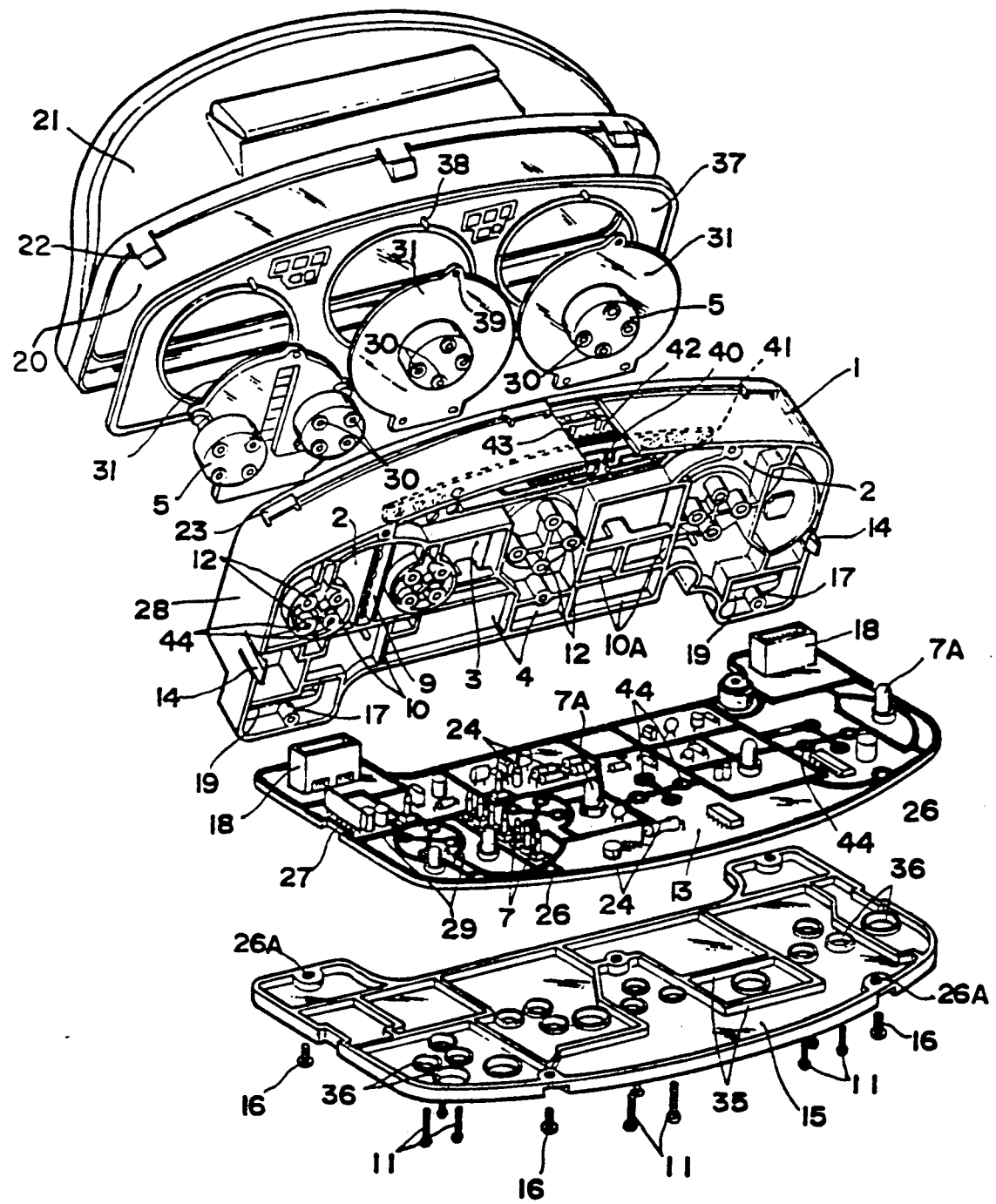

FIGS. 1 to 3 illustrates a first embodiment of this invention, in which is shown a casing 1 made of a synthetic resin of a color with a high light reflectance, such as a white color. The casing 1 has a front opening portion and a back opening portion. On the front side of the front opening portion, a partition wall 2 is provided to be integral with an inner peripheral side portion of the casing 1, whereby a front-side containing space 3 and a back-side containing space 4 are formed respectively on the front and back sides of the partition wall 2. The partition wall 2 is provided on the front side thereof with a plurality of mount surface portions 6 on which to mount main bodies 5 of electric meters such as cross-coil type instruments. The partition wall 2 is provided also with tubular portions 9 constituting chambers 8 for containing indication lamps 7 therein, the tubular portions 9 projected forward and being integral with the wall. On the back side of the partition wall 2, a plurality of frame-like ribs 10 are projected backward to partition the back-side containing space 4 into a plurality of containing spaces. Also, on the back side of the partition wall 2, a plurality of boss portions 12 for insertion of terminal screws 11 therethough are projected backward, in correspondence with the mount surface portions 6 respectively. The casing 1 is provided with elastic claw pieces 14 for fastening a circuit board 13, and with boss portions 17 for fixing screws 16 by which the circuit board 13 and a protective cover 15 are fastened together to the casing 1. The casing 1 is provided further with holes 19 for fitting connectors 18 which are attached to the circuit board 13, and with receiving portions 23 for elastic claw pieces 22 by which to fasten a hood 21 having a see-through plate 20.

The circuit board 13 is formed in substantially the same shape and size as the back opening portion of the casing 1. On the back side of the circuit board 13 is provided a circuit pattern (not shown) which constitutes driving circuits for the meter main bodies and lamps. Pluralities of electronic parts 24, indication lamps 7 and illuminating lamps 7A are mounted on the front side of the circuit board 13, and leads 25 of the electronic parts 24 are passed through through-holes (not shown) in the circuit board 13, to be soldered on the back side of the circuit board 13. On the front side of the circuit board 13, the connectors 18 are fixed at locations corresponding to the holes 19, whereas holes 26 for insertion of the screws 16 are formed in correspondence with the boss portions 17, and recessed from receiving portions 27 opened sideways are provided correspondingly to the elastic claw pieces 14. Further, on the front side of the circuit board 13, electronic parts 24 are mounted also at locations behind the mount surface portions 6. Marks 29 indicating the positions of contact of back end surfaces of peripheral side walls 28 and the ribs 10 of the casing 1 are provided on the front side of the circuit board 13, by silk screen printing or the like. The electronic parts 24 and the indication lamps 7 are mounted avoiding the marks 29. That is, when the electronic part 24 bends or falls down into the mounting position of the peripheral side wall 28 or the rib 10 (at which the casing 1 makes contact with the circuit board 13) after the electronic parts 24 are mounted on the circuit board 13, the bent or fallen electronic part 24 appears overlapping on the mark 29; therefore, accurate and speedy inspection and correction can be performed through visual inspection. It is thereby possible to obviate the trouble of the electronic part 24 being clamped between the casing 1 and the circuit board 13. It suffices to provide the marks 29 at least in the vicinity of the electronic parts 24 which are liable to fall down. Besides, the electronic parts 24 apt to generate heat, such as the illuminating lamps 7A and resistors, are mounted apart from the marks so that none of the ribs 10 and the peripheral side walls 28 is melted by the heat thus generated.

Each of the electric meter main bodies 5 is provided at an outside bottom portion thereof with a plurality of insertion holes 30 for terminal screws 11. To a front portion of the electric meter main body 5, a display board 31 illuminated by the illuminating lamp 7A when the surroundings are dark, as in the night, is attached by screws 32, to enable reading through comparison of a pointer 34 attached to a pointer shaft 33 of the meter main body 5 with graduations, numerals, symbols or the like on the display board 31.

The protective cover 15 is formed from a synthetic resin in substantially the same shape and size as the circuit board 13. Ribs 35 which, in part, have substantially the same shape and size as the marks 29 are projected on the front side of the cover 15. The protective cover 15 is provided also with through-holes 36 correspondingly to the positions of the terminal screws 11, the illuminating lamps 7A, and the like. At the peripheries of the through-holes 36, also, ribs 35 are projected forward to constitute barriers for preventing metallic members, for instance, screws from entering between the circuit board 13 and the protective cover 15 at the time of assembling operation or the like. Since the ribs 35 at the peripheries of the through-hole 36 are required only to prevent the penetration of screws, a narrow gap is left between the ribs 35 and the circuit board 13; however, the ribs 35 may be set in contact with the circuit board 13, like the other ribs 10. The protective cover 15 is provided also with holes 26A for the screws 16.

A facing board 37 is disposed on the front side of the display boards 31, and pins 38 projected on the back side of the facing board 37 are fitted into small holes 39 of the display boards 31 to firmly position the display boards 31 and the facing board 37 to each other.

In the back-side containing space 4 in the casing 1, a smaller-type circuit board 40 with indication lamps 7B and electronic parts 24 mounted thereon is disposed, and is attached to the casing 1 by screws 41. The circuit board 40 is provided with a connector 42.

In assembling, the smaller circuit board 40 is first disposed in the back-side containing space 4 in the casing 1, and fixed by the screws 41. Next, the larger circuit board 13 is tentatively fixed on the back opening portion side of the casing 1 by engagement of the elastic claw pieces 14 with the receiving portions 27. In this condition, the smaller circuit board 40 and the larger circuit board 13 are assembled in two layers on the back side of the casing 1, the frame-like ribs 10 are set in contact with the marks 29, so that the electronic parts 24 mounted on the circuit boards 13 and 14 are contained respectively in the plurality of chambers formed by partitioning the back-side containing space 4 by the ribs 10, and the indication lamps 7 and 7B are contained in the containing chambers 8 formed in the front-side containing space 3. In this case, the partition wall 2 is not provided in the areas corresponding to the illuminating lamps 7A, inclusive of the surrounding areas, and the amps 7A are surrounded by peripheral walls 10A formed by the frame like ribs 10. The connector 42 of the circuit board 40 is exposed through a side opening portion 43 of the casing 1, so that it can be connected to an external connector (not shown) extended from a battery. The connectors 18 of the larger circuit board 13 are fitted in the holes 19, so that they can be connected to external devices.

In the next place, the back side of the circuit board 13 is covered with the protective cover 15, and the screws 16 are passed through the hoes 26, 6A in the cover 15 and the board 13, to be screwed into the boss portions 17, whereby the circuit board 13 and the protective cover 15 are fixed to the casing 1. Then, the plurality of electric meter main bodies 5 in firm connection with the display boards 31 are contained into the front-side containing space 3 from the front opening portion side of the casing 1, and are placed on the mount surface portions 6 of the partition wall 2. In this condition, the terminal screws 11 are passed through the through-holes 36 in the protective cover 15 and the holes 44 in the circuit board 13, and inserted through the boss portions 12 of the partition walls 2 into the insertion holes 30 in the electric meter main bodies 5, to be engaged to terminals (not shown). By this, the electric meter main bodies 5 are attached to the casing 1, and the circuit pattern on the circuit board 13 is electrically connected to the electric meter main bodies 5 through the terminal screws 11. Subsequently, the facing board 37 is disposed at the front opening portion of the casing 1, and the facing board 37 and the display boards 31 are firmly positioned to each other by engagement between the pins 38 and the small holes 39. Further, the hood 21 is set into position from the front side of the facing board 37, and is attached to the casing 1 by engagement between the elastic claw pieces 22 and the receiving portions 23.

Thus, in this embodiment, the partition wall 2 is provided on the front side of the back opening portion of the casing 1 to form the front-side containing space 3 and the back-side containing space 4, the electric meter main bodies 5 are contained in the front-side containing space 3, the circuit board 13 is disposed on the back opening portion side of the casing 1 to contain the electronic parts 24 in the back-side containing space 4, the electric meter main bodies 5 are attached to the casing 1 by terminals screws 11, and the electric meter main bodies 5 and the circuit board 13 are electrically connected to each other, whereby the meter device is constructed. With this construction, assemblage of the meter device is facilitated, electrical connection is simplified, and the electronic parts 24 are protected by being located in the back-side containing space 4. More specifically, the flexible printed wiring board used in the conventional meter devices for the purpose of supplying an external power supply and detection signals to a circuit board in a casing can be reduced; therefore, the number of component parts is reduced, the construction is simplified, and there is no need for an operation of making electrical connection between the flexible printed wiring board disposed outside the casing and the circuit board disposed in the casing. In addition, the circuit board which has been disposed in the casing in the conventional meter devices is assembled on the back opening portion side of the casing 1 in this embodiment, so that the capacity of the front-side containing space 3 can be utilized effectively. Besides, in the prior art, the circuit board is disposed in the same space as that for containing the electric meter main bodies, and the circuit board would hinder the passage of light reflected on the inner surfaces of the casing. In this embodiment, on the other hand, the arrangement of the circuit board 13 on the back side of the partition wall 2 ensures easier reflection of light on the inner surfaces of the casing 1, thereby enhancing the reflection efficiency for the illuminating lamps 7A, and thermal influences on the electronic parts 4 can be obviated by the peripheral walls 10A. Further, since the back-side containing space 4 is partitioned into a plurality of chambers by the ribs 10, it is possible to prevent the electronic parts 24 from exerting thermal effects on each other. The ribs 10 function also to reinforce the casing 1 and to support the circuit board 13 favorably. Moreover, since the plurality of electric meter main bodies 5 can be driven by the single circuit board 13, a simpler construction is achieved.

Figure 4:
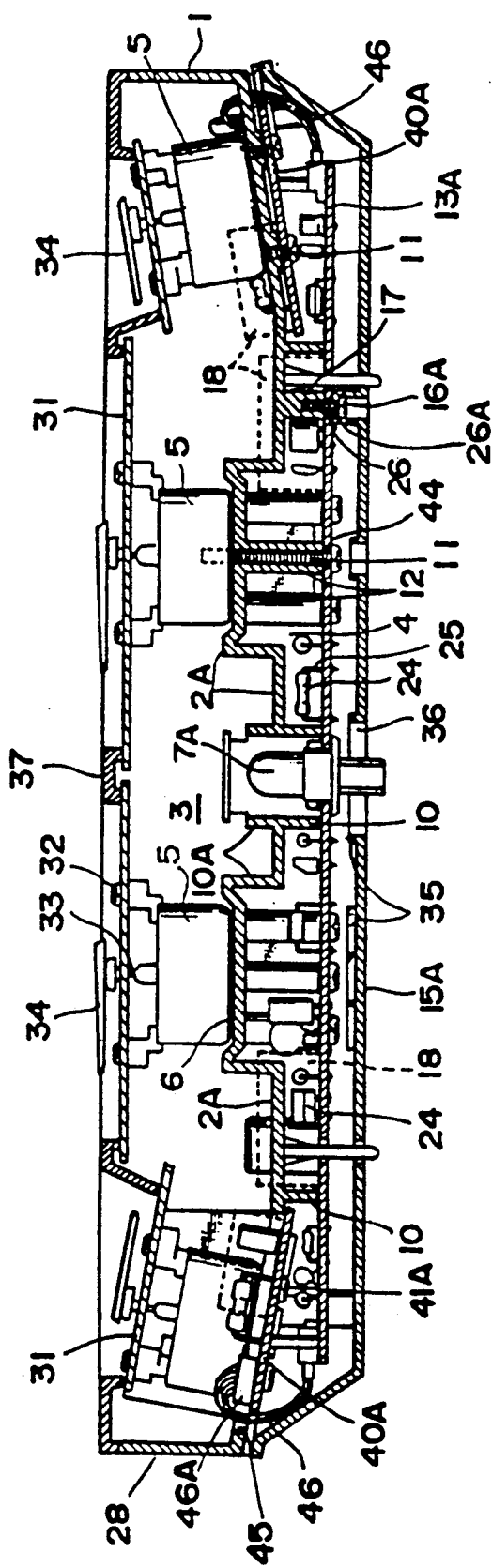
FIG. 4 is a sectional view showing a second embodiment of this invention.

Referring now to FIG. 4, there is shown a second embodiment of this invention. The same portions as those in the first embodiment are denoted by the same symbols as used above, and detailed explanation of such portions will be omitted. In this second embodiment both side portions of a partition wall 2A formed in one body with a casing 1 are inclined to the front side. Smaller-type circuit boards 40A are attached to the back side of the inclined partition wall 2A by screws 41A, and electric meter main bodies 5 are placed on mount surface portions 6 formed on the front side of the partition wall 2A. In this condition, the meter main bodies 5 are fixed in an inclined state by terminal screws 11, and the meter main bodies 5 and the circuit board 40A are electrically connected to each other. Electronic parts 24 are mounted on the front side of the circuit board 40A, so as to face a front-side containing space 3 via opening portions 45 formed in the partition wall 2A. To a back opening portion of the casing 1, a larger-type circuit board 13A is attached by screws 16A together with a protective cover 15A. Electronic parts 24 mounted on the front side of the circuit board 13A are contained, in a protected condition, in a back-side containing space 4 partitioned by ribs 10. The smaller circuit board 40A and the larger circuit board 13A are disposed in two layers, and are electrically connected to each other by cords 46 equipped with connectors 46A.

In this second embodiment, also, the partition wall 2A is provided on the front side of the back opening portion of the casing 1 to form the front-side containing space 3 and the back-side containing space 4, the electric meter main bodies 5 are contained int he front-side containing space 3, and the circuit board 13A is disposed on the back opening portion side of the casing 1, whereby the electronic parts 24 are contained in the back-side containing space 4. With this construction, a flexible printed circuit board can be reduced, assemblage of the meter device is facilitated, electrical connection is simplified, and the electronic parts 24 are protected.

This invention is not limited to the embodiments described above, and various modified executions of the invention are possible within the scope of the gist of the invention. For instance, the numbers of the electric meter main bodies and circuit boards provided in the casing, the vertical dimensions of the front and back opening portions, etc., may be selected according to circumstances. Furthermore, the protective cover may be provided with no through-holes and may be attached after the attachment of the circuit boards and the electric meter main bodies.

What is claimed is:

1. A meter device comprising:
   a continuous integral casing consisting of a common material, said casing including an outer peripheral portion circumscribing a containing space having a width defined by opposing ends of the peripheral portion, and a partition wall within the containing space delineating a front containing space and a rear containing space;
   an electric meter main body fixedly contained within the front containing space of the casing; and
   a circuit board having a major surface, said major surface including a plurality of electronic parts mounted thereon, said circuit board being attached to the casing at said rear containing space and electrically connected to the electric meter main body, wherein
   said major surface of said circuit board is directed toward, and is substantially parallel with, said partition wall, and at least one electronic part mounted on the circuit board is contained within the rear containing space of the casing.

2. The meter device as set forth in claim 1, further comprising a protective cover attached to the casing at the rear containing space for covering the circuit board.

3. The meter device as set forth in claim 1, further comprising a protective cover for the circuit board, the protective cover having an opening portion through which parts can be detachable fitted to the circuit board from outside of the protective cover.

4. The meter device as set forth in claim 3, wherein said protective cover includes a rib at a peripheral edge of the opening portion extending toward said rear containing space.

5. A meter device comprising
   a continuous integral casing consisting of a common material, said casing including an outer peripheral portion circumscribing a containing space having a width defined by opposing ends of the peripheral portion, and a partition wall within the containing space delineating a front containing space and a rear containing space,
   an electric meter main body fixedly contained within said front containing space, and
   a circuit board having a major surface, said major surface including a plurality of electronic parts mounted thereon, said circuit board being attached to the casing at said rear containing space, and electrically connected to the electric meter main body, wherein
   said partition wall includes ribs extending into said rear containing space defining a plurality of separate rear containing chambers enclosed by said circuit board, and respective electronic parts mounted on said major surface of said circuit board are contained within corresponding enclosed separate rear containing chambers.

6. The meter device as set forth in claim 5, wherein back ends of the ribs contact the major surface of the circuit board, and the major surface of the circuit board includes marks corresponding to the area of contact of said back ends of the ribs.

* * * * *